(12) United States Patent
Ott et al.

(10) Patent No.: US 12,123,920 B2
(45) Date of Patent: Oct. 22, 2024

(54) METHOD FOR ASCERTAINING AT LEAST ONE OPERATING PARAMETER FOR THE OPERATION OF AN ELECTRICAL ENERGY STORE, AND CORRESPONDING COMPUTER PROGRAM, MACHINE-READABLE STORAGE MEDIUM AND COMPUTER APPARATUS

(71) Applicant: Robert Bosch GmbH, Stuttgart (DE)

(72) Inventors: Julia Ott, Stuttgart (DE); Rainer Heinrich Hoerlein, Orion, MI (US); Shweta Vijay Pawar, Maharashtra (IN); Simon Tippmann, Stuttgart (DE); Vincent Scharff, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 647 days.

(21) Appl. No.: 17/415,007

(22) PCT Filed: Dec. 6, 2019

(86) PCT No.: PCT/EP2019/083935
§ 371 (c)(1),
(2) Date: Jun. 17, 2021

(87) PCT Pub. No.: WO2020/126538
PCT Pub. Date: Jun. 25, 2020

(65) Prior Publication Data
US 2022/0065943 A1 Mar. 3, 2022

(30) Foreign Application Priority Data
Dec. 17, 2018 (DE) .................. 10 2018 221 962.1

(51) Int. Cl.
*G01R 31/392* (2019.01)
*G01R 31/3842* (2019.01)
*B60L 58/16* (2019.01)

(52) U.S. Cl.
CPC ....... *G01R 31/392* (2019.01); *G01R 31/3842* (2019.01); *B60L 58/16* (2019.02);
(Continued)

(58) Field of Classification Search
CPC ... G01R 31/392; G01R 31/3842; B60L 58/16; B60L 2240/545; B60L 2240/547; B60L 2240/549
See application file for complete search history.

(56) References Cited

U.S. PATENT DOCUMENTS 9,583,796 B2 * 2/2017 Saha ..................... G01R 31/392
9,834,112 B2 * 12/2017 Lee ......................... H01M 10/46
(Continued)

FOREIGN PATENT DOCUMENTS

CN  103278777 A  9/2013
DE  102009042656 A1  3/2011
(Continued)

OTHER PUBLICATIONS

Translation of International Search Report for Application No. PCT/EP2019/083935 dated Jan. 21, 2020 (2 pages).

*Primary Examiner* — Elias Desta
(74) *Attorney, Agent, or Firm* — Michael Best & Friedrich LLP

(57) ABSTRACT

A method for ascertaining at least one performance characteristic for the operation of an electrical energy store is described, comprising the steps of: a) receiving operating data, in particular current and/or voltage and/or temperature measured values, of a multiplicity of electrical energy stores, wherein the multiplicity of electrical energy stores satisfy a predefined criterion, for example a predefined number of operating hours; b) ascertaining at least one ageing state variable, in particular an electrical capacitance, of the multiplicity of electrical energy stores by evaluating the oper-
(Continued)

ating data of the multiplicity of electrical energy stores; c) ascertaining at least one performance characteristic for the operation of an electrical energy store, in particular a maximum charging current, on the basis of the at least one ageing state variable; d) transmitting the at least one performance characteristic to a further multiplicity of electrical energy stores. Furthermore, a corresponding computer program, a corresponding machine-readable storage medium and a corresponding computer apparatus are described.

10 Claims, 3 Drawing Sheets

(52) U.S. Cl.
CPC ... *B60L 2240/545* (2013.01); *B60L 2240/547* (2013.01); *B60L 2240/549* (2013.01)

(56) References Cited

U.S. PATENT DOCUMENTS

| | | | |
|---|---|---|---|
| 10,035,427 | B2 | 7/2018 | Kratzer et al. |
| 2010/0121588 | A1* | 5/2010 | Elder ............... B60L 58/16 |
| | | | 702/85 |
| 2015/0239365 | A1* | 8/2015 | Hyde ................ B60L 58/26 |
| | | | 701/2 |
| 2017/0288414 | A1 | 10/2017 | Klein et al. |

FOREIGN PATENT DOCUMENTS

| | | |
|---|---|---|
| DE | 102010062856 A1 | 6/2012 |
| DE | 102014214314 A1 | 1/2016 |
| DE | 102017209674 A1 | 12/2018 |
| EP | 2151694 A2 | 2/2010 |
| EP | 3171186 A1 | 5/2017 |

* cited by examiner

METHOD FOR ASCERTAINING AT LEAST ONE OPERATING PARAMETER FOR THE OPERATION OF AN ELECTRICAL ENERGY STORE, AND CORRESPONDING COMPUTER PROGRAM, MACHINE-READABLE STORAGE MEDIUM AND COMPUTER APPARATUS

BACKGROUND OF THE INVENTION

The present disclosure is based on a method for ascertaining at least one operating parameter for the operation of an electrical energy store.

Electrical energy stores are becoming ever increasingly important in the wake of increasing electrification, in particular of motor vehicles. When operating these electrical energy stores, particular emphasis is placed on an aging which is as low as possible or appropriate for the application, i.e. a decrease in capacitance which is as low as possible or an increase in internal resistance which is as low as possible, for example. A corresponding aging can be divided roughly into two categories: a so called cyclic aging and a so called calendrical aging. A decrease in capacitance or increase in resistance during operation of the electrical energy store, i.e. under current output, is referred to as cyclic aging. An aging which occurs outside operation is referred to as calendrical aging.

In particular in the case of a motor vehicle with an electrical energy store, both effects have a relevant influence. However, with respect to both influencing variables, there are options for reducing this influence. For example, in the case of a very high charge state, the aging of an electrical energy store is in most cases significantly higher than in the case of a low or reduced charge state. For this reason, under certain circumstances, the battery is not fully charged, i.e. up to the technically or physically highest possible charge state, despite this being indicated to a user.

The application possibilities for the electrical energy store are therefore in turn reduced, since an electric range of an electric vehicle is reduced, for example. This is disadvantageous due to the already limited electric range of the electric vehicle. Ideally, a balance can be found between excessive aging and a correspondingly high charge state.

Furthermore, a maximum possible charging current, in particular at temperatures below 5° C., is severely limited, for example, in order to prevent a capacitance loss of the electrical energy store by way of the charging process. This therefore has a negative impact on charging time, in particular in the case of full charge, of the electrical energy store.

Corresponding operating parameters, for example a maximum permissible charge state or a maximum permissible charging current, are stored in a battery management system and are correspondingly used during operation of the electrical energy store, wherein the corresponding values have been ascertained before the actual operation of the electrical energy store, for example as a result of laboratory experiments. Findings from the operation of the electrical energy store are thus not incorporated into the adjustment of the operating parameter.

SUMMARY OF THE INVENTION

A method for ascertaining at least one operating parameter for the operation of an electrical energy store is disclosed.

In this case, operating data of a multiplicity of electrical energy stores are received, wherein the multiplicity of electrical energy stores meets a predefined criterion. Operating data from electrical energy stores can comprise, for example, current measured values, voltage measured values, temperature measured values, a number of switching processes of electrical and/or mechanical switches, a number of operating hours of an electrical energy store, a predefined electrical energy throughput through an electrical energy store and/or a predefined electrical charge throughput through an electrical energy store. One possible predefined criterion is, for example, the predefined number of operating hours of an electrical energy store or the predefined electrical energy throughput through an electrical energy store or the predefined electrical charge throughput through an electrical energy store.

Furthermore, at least one aging state variable of the multiplicity of electrical energy stores is ascertained, wherein this takes place by evaluating the operating data of the multiplicity of electrical energy stores. A corresponding aging state variable is the electrical capacitance of an electrical energy store, for example. In this case, suitable algorithms can be put to use, such as estimation procedures based on the method of least squares, for example. In this case, only some of the operating data of the multiplicity of electrical energy stores can be evaluated, such that operating data of a certain number of energy stores of the multiplicity of energy stores may not be evaluated.

Furthermore, at least one operating parameter for the operation of an electrical energy store is ascertained, wherein ascertaining the operating parameter is based on the at least one aging state variable. A corresponding operating parameter comprises a maximum possible charging current at a predefined temperature or a maximum possible charge state or a minimum possible charge state, for example.

Furthermore, the at least one operating parameter is transmitted to a further multiplicity of electrical energy stores. In this case, the further multiplicity can comprise, for example, electrical energy stores which do not meet the predefined criterion, commonly are little used. The further multiplicity can also be identical to the multiplicity.

The method has the advantage that the data and findings which are acquired from the operation of much-used electrical energy stores are also transmitted to energy stores which are little used. These little-used electrical energy stores can thus be operated in an optimized manner, despite the fact that they do not have enough own operating data yet in order to enable a useful adjustment of the operating parameters from the own operating data. The findings that are acquired from the operation of the multiplicity of electrical energy stores which meet the predefined criterion are thus transmitted in an advantageous manner to further electrical energy stores, for example those which are little used.

Within the method, an aging model of an electrical energy store is advantageously adjusted depending on the at least one aging state variable and the operating data. In this case, the aging model comprises an allocation rule between the aging state variable and a further variable, wherein the further variable is in particular a charge throughput of an electrical energy store. The aging model is thus adjusted in such a way, for example, that a capacitance loss described by the aging model, depending on the charge throughput, is adjusted to the capacitance loss ascertained from the operating data depending on the charge throughput. For example, the operating data can show that the electrical energy stores age more quickly than the aging model predicts, i.e. lose more capacitance than predicted. As a result, it is necessary to adjust the aging model. The advantage of this is that a more precise estimation of the aging of an electrical energy store is possible, which facilitates safe operation of the electrical energy store. The aging model can be realized as a characteristic map in a data store or as a mathematical function, for example.

Furthermore, the operating parameter is advantageously ascertained depending on the aging model. The advantage of this is that an aging optimized operation of an electrical energy store is enabled, i.e. the lifespan of an electrical energy store can be extended or it can be adjusted to the required lifespan of the electrical energy store, for example. An increased aging can therefore be reduced again to a desired level in an advantageous manner, for example.

The multiplicity of electrical energy stores is advantageously divided into classes based on the operating data. Furthermore, ascertaining the at least one aging state variable takes place in each case for at least one electrical energy store from each class. This is advantageous since an aging state variable is not ascertained for each electrical energy store, but rather for at least one representative from each class, which significantly reduces the evaluation effort, in particular the computing and storage effort. However, as a result of the division into classes, essential properties or characteristics of the electrical energy stores are taken into account when ascertaining the aging state variable. For example, a division into classes can take place using the charge throughput of the electrical energy stores. This therefore also makes it possible to evaluate a large number of electrical energy stores, for example several thousand or hundred thousand, or the operating data thereof, in an efficient manner.

The further multiplicity of electrical energy stores advantageously comprises at least a plurality of electrical energy stores which do not meet the predefined criterion. The advantage of this is that findings which are acquired from the operating data of the electrical energy stores which meet the predefined criterion are used in a targeted manner for electrical energy stores which do not meet this criterion, commonly are little used. The operation of these electrical energy stores is thus optimized.

The operating parameter advantageously comprises a maximum permissible temperature of an electrical energy store, a maximum permissible temperature rise of the temperature of an electrical energy store, a maximum permissible ion concentration in an energy storage unit of an electrical energy store and/or a minimum permissible ion concentration in an energy storage unit of an electrical energy store and/or a minimum permissible overpotential in an electrode of an electrical energy store. This is advantageous since in particular a high temperature has a severely negative influence on the lifespan of an electrical energy store. The same applies to a sharp rise in the temperature of an electrical energy store. By contrast, an increase in these values can have a positive effect on the electrical power of the electrical energy store, since a higher current can be retrieved, for example. Depending on the findings acquired from the operating data, in the context of the aging state variable, an increase or reduction in the maximum permissible temperature or the maximum permissible temperature rise can thus arise as the result of ascertaining the operating variable. Similar applies to the ion concentration in an energy storage unit of an electrical energy store, for example a battery cell. Determining a minimum permissible overpotential is advantageous since if it is fallen short of, undesirable secondary reactions may take place in the electrode, for example lithium deposition.

The disclosed method is advantageously carried out by a computer apparatus which is located outside the electrical energy store. This computer apparatus can be a computer server, for example. This is advantageous since a computer apparatus of this type possesses greater computing power and storage capacity than battery management control apparatuses typically present in an electrical energy store and complex evaluations of operating data are therefore possible. Furthermore, the computer apparatus is easy to maintain and manage as a central data aggregation body of the operating data of the multiplicity of electrical energy storage units.

Furthermore, a computer program which is set up to carry out all of the steps of the disclosed method is the subject matter of the disclosure. The above mentioned advantages shall apply accordingly.

Furthermore, a machine-readable storage medium on which the disclosed computer program is stored is the subject matter of the disclosure. The above mentioned advantages shall apply accordingly.

Furthermore, a computer apparatus which is set up to carry out all of the steps of the disclosed method is the subject matter of the disclosure. The above mentioned advantages shall apply accordingly.

An electrical energy storage unit can in particular be understood to mean an electrochemical battery cell and/or a battery module with at least one electrochemical battery cell and/or a battery pack with at least one battery module. For example, the electrical energy storage unit can be a lithium-based battery cell or a lithium-based battery module or a lithium-based battery pack. In particular, the electrical energy storage unit can be a lithium-ion battery cell or a lithium-ion battery module or a lithium-ion battery pack. Furthermore, the battery cell can be of the lithium polymer accumulator, nickel-metal hydride accumulator, lead-acid accumulator, lithium-air accumulator or lithium-sulfur accumulator type or, more generally, an accumulator of any electrochemical composition. It is also possible for a capacitor to be an electrical energy storage unit.

An electrical energy store is, for example, a battery which comprises a plurality of battery modules and moreover has a battery management system by means of which data can be exchanged with the computer apparatus, for example.

BRIEF DESCRIPTION OF THE DRAWINGS

Advantageous embodiments of the invention are represented in the figures and are further specified in the subsequent description.

In the drawings.

DETAILED DESCRIPTION

The same reference numbers refer to the same device components or the same method steps in all of the figures.

Figure 1:
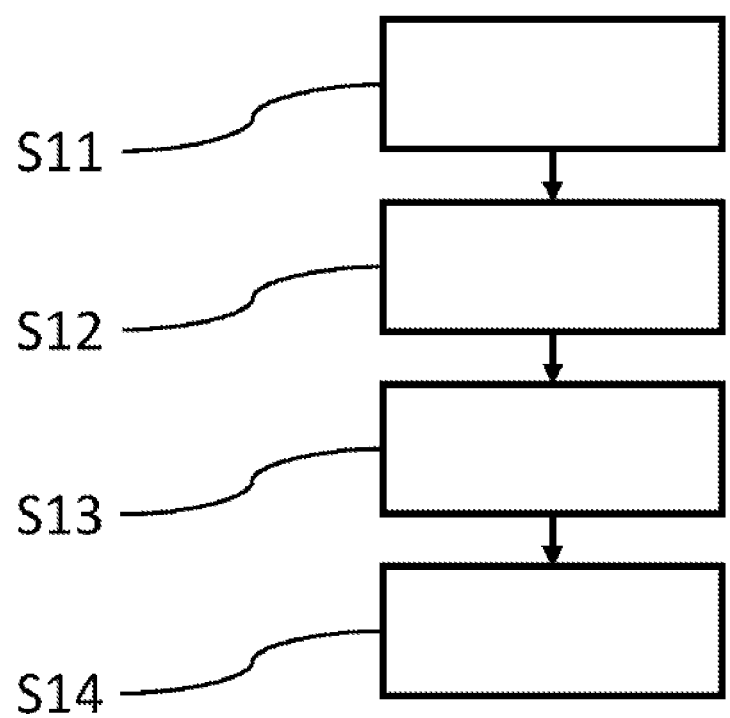
FIG. 1 shows a flow diagram of the disclosed method according to a first embodiment.

FIG. 1 shows a flow diagram of the disclosed method according to a first embodiment. In this case, in a first step S11, current measured values, voltage measured values and temperature measured values of a multiplicity of electrical energy stores are received. In this case, the multiplicity of electrical energy stores exceeds a predefined number of operating hours. This means that the energy stores have a certain utilization ratio. In this case, the electrical energy stores comprise at least one electrical energy storage unit.

In a second step S12, the operating data of the multiplicity of electrical energy stores are evaluated and the respective remaining electrical capacitance of the multiplicity of electrical energy stores is ascertained as a result. In this case, the remaining electrical capacitance is a measure or variable for the aging state of the respective electrical energy store.

In a third step S13, based on the ascertained remaining electrical capacitances, a maximum charging current value with which a corresponding electrical energy store can be charged at the most during operation is ascertained. If, for example, it has been ascertained in the second step S12 that the respective aging state of the multiplicity of electrical energy stores, i.e. the respective remaining electrical capacitance, taking into account the respective number of operating hours, falls below a predefined limit value, the electrical energy stores consequently aging undesirably faster, the maximum charging current value is reduced, which facilitates slower aging. The maximum charging current value can also be increased if it has been ascertained that the remaining electrical capacitance is above the predefined limit value.

In a fourth step S14, the ascertained maximum charging current value is transmitted to a further multiplicity of electrical energy stores, wherein the further multiplicity of electrical energy stores preferably has fewer operating hours than the multiplicity of electrical energy stores. The further multiplicity of electrical energy stores can therefore use the ascertained maximum charging current value in order to avoid increased aging, for example.

Figure 2:
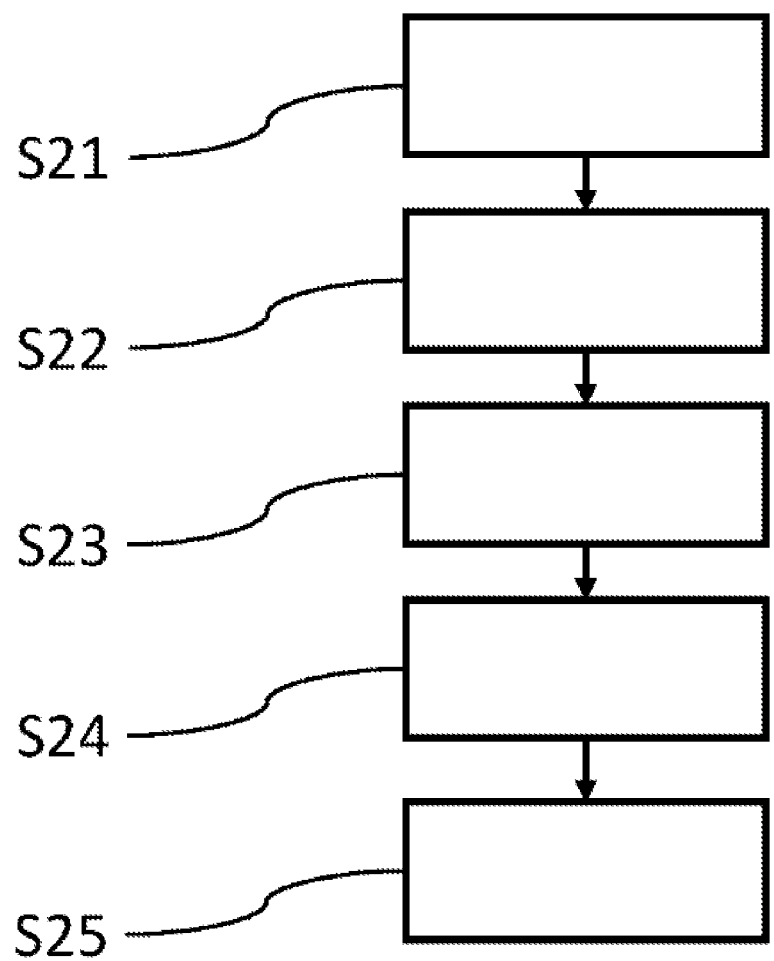
FIG. 2 shows a flow diagram of the disclosed method according to a second embodiment.

FIG. 2 shows the flow diagram of the disclosed method according to a second embodiment. In a first step S21, current measured values, voltage measured values and temperature measured values of a multiplicity of electrical energy stores are received. In this case, the respective electrical energy stores of the multiplicity of electrical energy stores exceed a predefined electrical charge throughput and therefore have at least one predefined level of electrical utilization.

In a second step S22, an electrical internal resistance is ascertained in each case for a selected number of electrical energy stores of the multiplicity of electrical energy stores, wherein this takes place by means of an evaluation of the current measured values, voltage measured values and temperature measured values of the selected number of electrical energy stores. Thus not all operating data are evaluated. The selected number can comprise a predefined number of randomly selected electrical energy stores from the multiplicity of electrical energy stores, for example. Furthermore, within the context of the evaluation, the dependence of the electrical internal resistance on the temperature can additionally be ascertained.

In a third step S23, an aging model, which reproduces a predetermined relationship between the electrical internal resistance of an electrical energy store and the electrical charge throughput thereof, is adjusted. Since the aging model is based on predetermined data which, for example, have been acquired in the context of laboratory experiments, they do not necessarily reflect the aging in a specific application. In the second step S22, the electrical internal resistance was ascertained for a selected number of electrical energy stores. Since the respective electrical charge throughput of this selected number of electrical energy stores is known or can be calculated in a simple manner from the transmitted operating data, this knowledge is used in order to adjust the aging model to the actual circumstances of the specific application. If the electrical energy stores age to a greater degree than the aging model predicts, for example, i.e. if they have a higher electrical internal resistance than predicted, this is taken into account by adjusting the aging model for the future.

In a fourth step S24, a maximum permissible temperature for the operation of an electrical energy store is ascertained, wherein in this case it is taken into account that an aging of an electrical energy store or the electrical energy storage units which constitute it, thus the increase in the electrical internal resistance of an electrical energy storage unit, at high temperatures near the maximum permissible temperature, for example for lithium-ion cells in the range around 45° C., is typically greater than at lower temperatures, for example in the range of 30° C. to 35° C. In this case, the maximum permissible temperature is based on the internal resistance values ascertained in the second step S22, in order to either increase the maximum permissible temperature if a greater aging is possible or in order to reduce the maximum permissible temperature if a less significant aging is required.

In a fifth step S25, the maximum permissible temperature ascertained in the fourth step S24 is subsequently transmitted to a further multiplicity of electrical energy stores, wherein the further multiplicity may comprise the electrical energy stores which are not included in the selected number, for example, see the second step S22 above.

Figure 3:
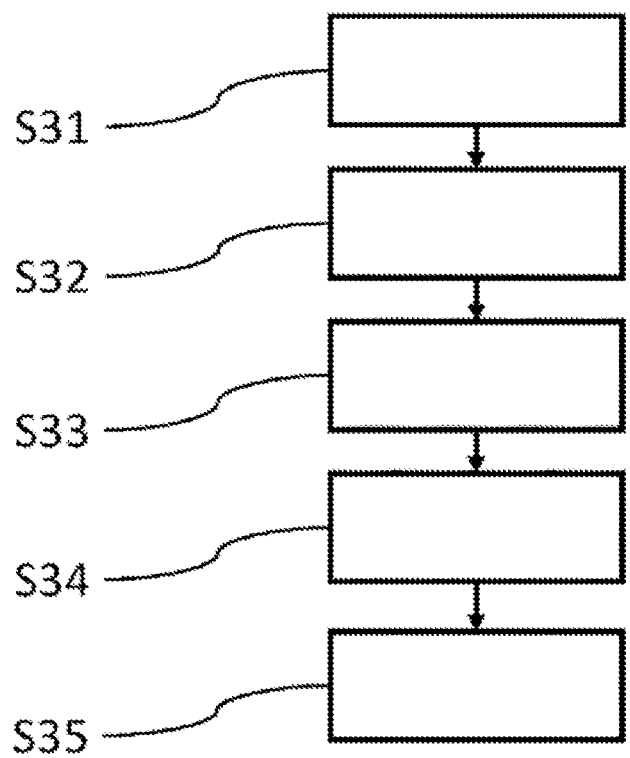
FIG. 3 shows a flow diagram of the disclosed method according to a third embodiment.

FIG. 3 shows a flow diagram of the disclosed method according to a third embodiment. In a first step S31, current measured values, voltage measured values and temperature measured values are received as operating data of a multiplicity of electrical energy stores. In this case, the respective electrical energy stores of the multiplicity of electrical energy stores exceed a predefined electrical charge throughput and therefore have at least one predefined level of electrical utilization.

In a second step S32, the electrical energy stores of the multiplicity of electrical energy stores are divided into classes based on their respective charge throughput. Each electrical energy store already exceeds at least the predefined charge throughput. For example, a division into three classes may be suitable. For this purpose, the charge throughput of the electrical energy store which is used the least and of the energy store which is used the most can be considered, for example, wherein their difference is ascertained and divided into three equally sized ranges. Starting from the energy store which is used the least, a corresponding division into classes can take place using this trisection.

In a third step S33, the operating data for a predefined number of electrical energy stores from each class are evaluated and the respective remaining electrical capacitance of the electrical energy stores is ascertained as a result. In this case, the remaining electrical capacitance is a measure or variable for the aging state of the respective electrical energy store.

In a fourth step S34, based on the ascertained remaining electrical capacitances, a minimum permissible overpotential in an electrode of the electrical energy store is ascertained which is still permissible there as a minimum lower limit value. Since an overpotential of this type can only be measured with difficulty or not at all, it is ascertained simulatively during operation of the electrical energy store by means of a mathematical model, for example by Fuller-Doyle-Newman. The minimum permissible overpotential is therefore considered for comparison with the simulatively ascertained value. If the minimum permissible value is fallen short of, the management system, for example a battery management system, which is associated with the corresponding electrical energy store must take appropriate measures, for example a current reduction.

In a fifth step S35, the minimum permissible overpotential ascertained in the fourth step S34 is subsequently transmitted to a further multiplicity of electrical energy stores, wherein the further multiplicity may comprise the electrical energy stores which are not included in the predefined number, for example, see the second step S33 above. The minimum permissible overpotential is preferably also transmitted to electrical energy stores which have not yet reached the predefined electrical charge throughput in order to favorably influence their behavior, in particular aging.

Figure 4:
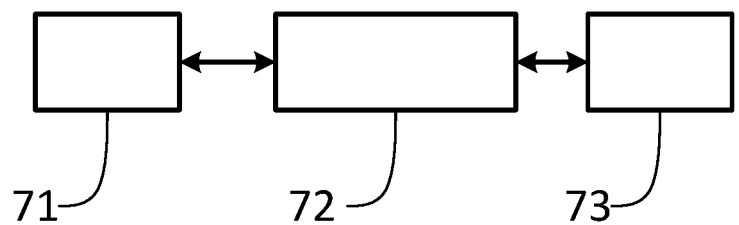
FIG. 4 shows a schematic representation of the disclosed computer apparatus according to one embodiment.

FIG. 4 shows a schematic representation of the disclosed computer apparatus 72 according to one embodiment. In this case, an electrical energy store 71 of a multiplicity of electrical energy stores which are not represented is represented in an exemplary manner, which electrical energy store can exchange data with the computer apparatus 72, which is symbolized by the corresponding double pointed arrow. Furthermore, a further electrical energy store 73 is represented to which an ascertained operating parameter can be transmitted from the computer apparatus 72, which is symbolized by the corresponding double pointed arrow. In this case, the double point of the respective arrow signifies that data can be exchanged in both directions.

The invention claimed is:

1. A method for ascertaining at least one operating parameter for the operation of an electrical energy store, the method comprising:
    a) receiving operating data of a multiplicity of electrical energy stores, wherein each electrical energy store of the multiplicity of electrical energy stores meets a predefined number of operating hours;
    b) ascertaining at least one aging state variable of the multiplicity of electrical energy stores by evaluating the operating data of the multiplicity of electrical energy stores;
    c) ascertaining at least one operating parameter for the operation of an electrical energy store, based on the at least one aging state variable; and
    d) transmitting the at least one operating parameter to a further multiplicity of electrical energy stores.

2. The method as claimed in claim 1, further comprising:
    e) adjusting an aging model of an electrical energy store, wherein the aging model comprises an allocation rule between the aging state variable and a charge throughput of an electrical energy store, depending on the at least one aging state variable and the operating data.

3. The method as claimed in claim 2, wherein in step c) ascertaining the operating parameter additionally takes place depending on the aging model.

4. The method as claimed in claim 1, further comprising:
    f) dividing the multiplicity of electrical energy stores into classes based on the operating data, wherein ascertaining the at least one aging state variable in step b) takes place in each case for at least one electrical energy storage unit from each class.

5. The method as claimed in claim 1, wherein the further multiplicity of electrical energy stores comprises at least a plurality of electrical energy stores which do not meet the predefined number of operating hours.

6. The method as claimed in claim 1, wherein the operating parameter is one selected from the group consisting of a maximum permissible temperature of the electrical energy store, a maximum permissible temperature rise of the temperature of the electrical energy store, a maximum permissible ion concentration in an energy storage unit of the electrical energy store, a minimum permissible ion concentration in an energy storage unit of the electrical energy store, and a minimum permissible overpotential in an electrode of the electrical energy store.

7. The method as claimed in claim 1, wherein the method is carried out by a computer apparatus (72) which is located outside the electrical energy store.

8. A non-transitory, computer-readable storage medium containing instructions that when executed by a computer cause the computer to control the operation of an electrical energy store to:
    a) receive operating data of a multiplicity of electrical energy stores, wherein each electrical energy store of the multiplicity of electrical energy stores meets a predefined number of operating hours criterion;
    b) ascertain at least one aging state variable of the multiplicity of electrical energy stores by evaluating the operating data of the multiplicity of electrical energy stores;
    c) ascertain at least one operating parameter for the operation of the electrical energy store, based on the at least one aging state variable; and
    d) transmit the at least one operating parameter to a further multiplicity of electrical energy stores.

9. An apparatus (72) configured to control the operation of an electrical energy store, the apparatus comprising a computer configured to:
    a) receive operating data of a multiplicity of electrical energy stores, wherein each electrical energy store of the multiplicity of electrical energy stores meets a predefined number of operating hours;
    b) ascertain at least one aging state variable of the multiplicity of electrical energy stores by evaluating the operating data of the multiplicity of electrical energy stores;
    c) ascertain at least one operating parameter for the operation of the electrical energy store, based on the at least one aging state variable; and
    d) transmit the at least one operating parameter to a further multiplicity of electrical energy stores.

10. The apparatus as claimed in claim 9, wherein the further multiplicity of electrical energy stores comprises at least a plurality of electrical energy stores which do not meet the predefined number of operating hours.

* * * * *